United States Patent [19]
Naito et al.

[11] Patent Number: 5,173,670
[45] Date of Patent: Dec. 22, 1992

[54] DESIGNING METHOD OF π TYPE LC FILTER

[75] Inventors: Yasuyuki Naito; Hiroshi Morii; Takeshi Azumi; Yoshiaki Kohno, all of Nagaokakyo, Japan

[73] Assignee: Murata Manufacturing Co., Ltd., Kyoto, Japan

[21] Appl. No.: 671,931

[22] Filed: Mar. 20, 1991

Related U.S. Application Data

[63] Continuation-in-part of Ser. No. 507,563, Apr. 11, 1990, abandoned.

[30] Foreign Application Priority Data

Apr. 12, 1989 [JP] Japan .................................. 1-93827

[51] Int. Cl.⁵ .............................................. H03H 7/01
[52] U.S. Cl. .................................. 333/184; 333/185; 336/200; 361/321
[58] Field of Search ............... 333/185, 184, 12, 181; 361/306 C, 321 F, 321 C, 321 R, 400–402

[56] References Cited

U.S. PATENT DOCUMENTS

| | | | |
|---|---|---|---|
| 4,746,557 | 5/1988 | Sakamoto et al. | 428/138 |
| 4,801,904 | 1/1989 | Sakamoto et al. | 333/185 X |
| 4,810,983 | 3/1989 | Okubo | 333/185 X |
| 4,904,967 | 2/1990 | Morii et al. | 333/185 |
| 4,918,570 | 4/1990 | Okamura et al. | 361/321 |
| 5,051,712 | 9/1991 | Naito et al. | 333/184 X |

Primary Examiner—Eugene R. LaRoche
Assistant Examiner—Seung Ham
Attorney, Agent, or Firm—Wenderoth, Lind & Ponack

[57] ABSTRACT

A method of designing a π type LC filter includes laminating dielectric layers on top and bottom sections of a magnetic material layer, forming a first external electrode and a second external electrode on each end of the laminated body, forming a third external electrode at a center section of the laminated body, forming an inductor by at least one conductor line within the magnetic material layer, connecting one end of the conductor line to the first external electrode and the other end thereof to the second external electrode, and forming a first capacitor composed of a parallel capacitor electrode within the top dielectric layer. One of the parallel capacitor electrodes is connected to the first external electrode and the other is connected to the third external electrode. Additionally, a second capacitor is formed composed of a pair of parallel capacitor electrodes within the bottom dielectric layer. One of the parallel capacitor electrodes is connected to the second external electrode and the other to the third external electrode. The π type LC filter is mounted on a substrate having at least three electrodes wherein first and second lead inductance components $L_1$ and $L_2$ are formed. The external electrodes and capacitor electrodes are shaped and sized such that a ratio $\alpha$ ($L_1/L_2$ or $L_2/L_1$) is greater than or equal to 1.2 and less than or equal to 2.3.

2 Claims, 5 Drawing Sheets

| | (Equivalent) circuit | Insertion loss characteristic |
|---|---|---|
| Capacitor type |  | −20dB/dec |
| Inductor type |  | −20dB/dec |
| L type |  | −40dB/dec |
| π type |  | −60dB/dec |

DESIGNING METHOD OF π TYPE LC FILTER

This application is a continuation-in-part application of application Ser. No. 07/507,563, which was filed on Apr. 11, 1990 now abandoned.

BACKGROUND OF THE INVENTION

1. Field of the Invention

The present invention relates to a method of designing and forming a laminated chip type LC filter which may, for example, suitably be used as a noise filter for EMI and the like.

2. Description of the Prior Art

FIG. 1 is a table depicting equivalent circuit and insertion loss characteristics of various LC filters. As is evident from FIG. 1, capacitor and induction type filters have an insertion loss of approximately $-20$ dB/dec, the L type filter has an insertion loss of approximately $-40$ dB/dec, and the π type filter has an insertion loss of approximately $-60$ dB/dec. The π type filter, which has a relatively large number of elements, exhibits favorable characteristics as compared with the capacitor, induction and L type filters since the change in insertion loss of the π type filter is very sharp with respect to frequency.

As an embodiment of the π type LC filter, the structure illustrated in FIGS. 2, 3 and 4 is available, where FIG. 4 shows only a conductor line 4 and capacitor electrodes 5, 6, 7 & 8. (The applicant discloses this structure in U.S. Pat. No. 5,051,712.) This n type LC filter is made up of a laminated body having top and bottom dielectric layers 2, 3 formed on opposite sides of a magnetic material layer 1, and includes first and second external electrodes 10, 12 formed at opposite ends of the laminated body, and a third external electrode 12 formed at a center section of the laminated body. An inductor 13 is formed by at least one conductor line 4 located within the magnetic material layer 1 and having one end connected to the first external electrode 10 and another end to the second external electrode 11. A first capacitor 14 is formed by a pair of parallel capacitor electrodes 5, 6 located within the top dielectric layer 2. The capacitor electrode 5 and the capacitor electrode 6 are connected to the first external electrode 10 and the third external electrode 12, respectively. A second capacitor 15 is formed by a pair of parallel capacitor electrodes 7, 8 located within the bottom dielectric layer 3. The capacitor electrode 7 and the capacitor electrode 8 are connected to the second external electrode 11 and the third external electrode 12, respectively.

However, when the π type LC filter as described above is, as shown in FIG. 5, mounted by soldering 24 on a printed circuit board 23 having surface electrodes 20, 21 and 22 formed thereon, the insertion loss characteristic can deteriorate in the high frequency range as shown in FIG. 6. This is due to the presence of lead inductance components $L_1$ and $L_2$ as shown in FIG. 7. The lead inductance component $L_1$ is generated by the surface electrode 20, the first external electrode 10, the capacitor electrode 5, the capacitor electrode 6, the third external electrode 12 and the surface electrode 22, whereas the lead inductance component $L_2$ is generated by the surface electrode 21, the second external electrode 11, the capacitor electrode 7, the capacitor electrode 8, the third external electrode 12 and the surface electrode 22. These lead inductance components $L_1$ and $L_2$ resonate with the capacitance $C_1$ of the first capacitor 14 and the capacitance $C_2$ of the second capacitor 15, respectively, thus causing the insertion loss deterioration shown in FIG. 6.

SUMMARY OF THE INVENTION

It is an object of the present invention to solve the problems of the π type LC filter as described above, and to provide method of designing and forming a π type LC filter having an insertion loss characteristic which does not deteriorate in the high frequency range.

A π type LC filter according to the method of the present invention includes: a laminated body having top and bottom dielectric layers formed on opposite surfaces of a magnetic material layer; first and second external electrodes formed at opposite ends of the laminated body; a third external electrode formed at the center portion of the laminated body; an inductor having at least one conductor line formed within the magnetic material layer, one end of the conductor line being connected to the first external electrode and the other end of the conductor line being connected to the second external electrode; a first capacitor having a pair of parallel capacitor electrodes formed within the top dielectric layer, one of the capacitor electrodes being connected to the first external electrode and the other of the capacitor electrodes being connected to the third external electrode; and a second capacitor having a pair of parallel capacitor electrodes formed within the bottom dielectric layer, one of the capacitor electrodes being connected to the second external electrode and the other of the capacitor electrodes being connected to the third external electrode.

The present invention entails designing and forming such a π type LC filter as described below.

When the π type LC filter is mounted by soldering on a substrate having at least 3 surface electrodes formed thereon, a first lead inductance component $L_1$ is generated via the first capacitor between the surface electrode of the substrate on which the first external electrode is soldered and the surface electrode of the substrate on which the third external electrode is soldered, and a second lead inductance component $L_2$ is generated via the second capacitor between the surface electrode of the substrate on which the second external electrode is soldered and the surface electrode of the substrate on which the third external electrode is soldered. A ratio between $L_1$ and $L_2$ is denoted $\alpha$. The shape and dimensions of each of the external electrodes and capacitor electrodes is determined so that $\alpha$ is maintained in the following range:

$$1.2 \leq \alpha \leq 2.3$$

where $\alpha = L_1/L_2$ or $\alpha = L_2/L_1$.

The reason for fixing the ratio $\alpha$ within the range 1.2 to 2.3 is that when $\alpha$ is set at less than 1.2, the capacitance of a capacitor will resonate with the lead inductance component, with the result being that the insertion loss characteristic will sharply deteriorate in the frequency range which is higher than that of the bottom section A shown in FIG. 6, and when $\alpha$ is set at more than 2.3, the two bottom sections A and B shown in FIG. 6 will depart from each other, causing the insertion loss characteristic at the intermediate section to deteriorate.

DESCRIPTION OF THE PREFERRED EMBODIMENT

The preferred embodiments of a $\pi$ type LC filter according to the present invention will be hereinafter explained with reference to FIG. 2 thru FIG. 5 and FIG. 7 of the accompanying drawings, with the above description as to the "Prior Art" regarding these figures being omitted below.

Figure 1:
FIG. 1 is a table showing characteristics of prior art LC filters.
Figure 1:
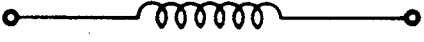
Figure 1:
Figure 1:
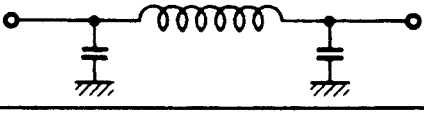
Figure 2:
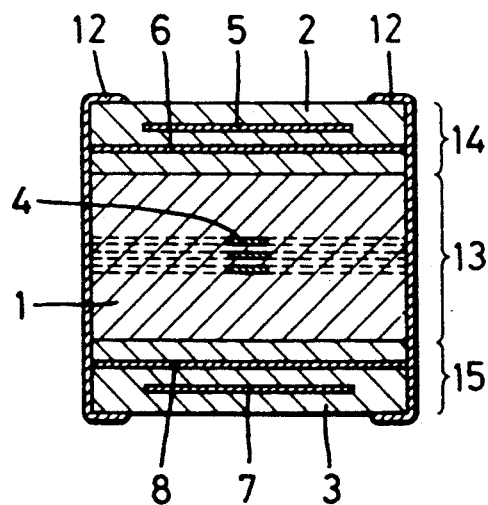
FIG. 2 is a transverse cross-sectional view illustrating an example of a $\pi$ type LC filter structure to be adopted according to the present invention.
Figure 3:
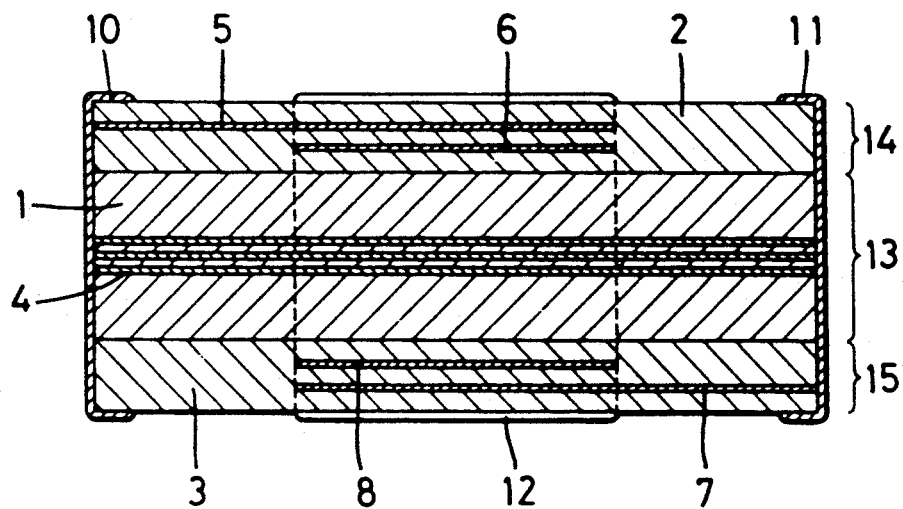
FIG. 3 is a longitudinal cross-sectional view of the same.
Figure 4:
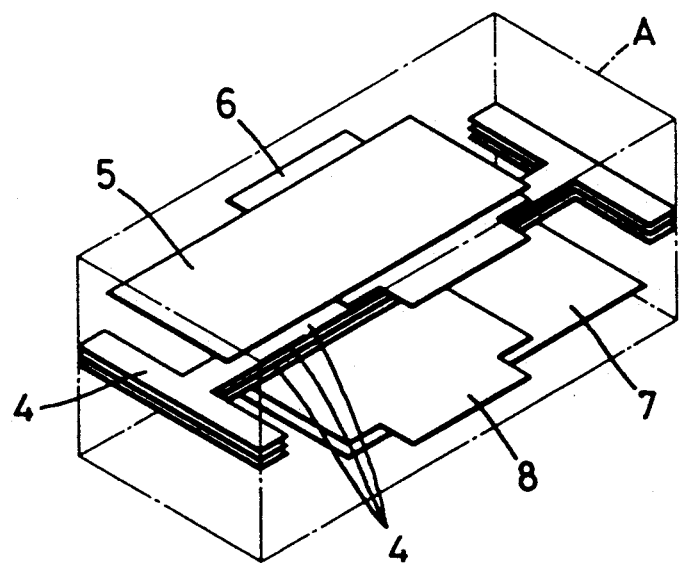
FIG. 4 is a perspective view of the above example, showing internal conductor lines and internal electrodes.

As illustrated in FIG. 2 thru FIG. 4, the $\pi$ type LC filter consists of a laminated body having top and bottom dielectric layers 2, 3 formed on opposite surfaces of a magnetic material layer 1, a conductor line 4 located within the magnetic material layer 1, capacitor electrodes 5, 6 located within the top dielectric layer 2, and capacitor electrodes 7, 8 located within the bottom dielectric layer 3.

This $\pi$ type LC filter can be manufactured, for example, by the following method.

First, the following material is prepared for magnetic material layer 1:

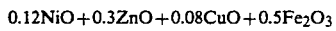

The following material is then prepared for the dielectric layer 2:

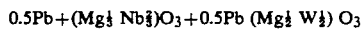

The material of each of the magnetic material layer 1 and the dielectric layer 2 is formed into a green sheet by sheet casting using an organic resin binder.

Then, from among the green sheets for the magnetic material layer 1, a paste consisting mainly of Ag-Pb powder, having a ratio of 9 to 1, is pattern-printed on the specified sheets, thereby forming a conductor line 4. Furthermore, a paste consisting mainly of Ag-Pb powder, having a ratio of 9 to 1, is pattern-printed on specified sheets from among the green sheets for the dielectric layer 2, thereby forming capacitor electrodes 5, 6, 7 and 8.

Then, green sheets for the magnetic material layer 1 and those for the dielectric layer 2 are laminated in the specified sequence, and after heat-pressing, are cut into blocks and baked in the atmosphere at 950° C. for 2 hours.

Then, a paste consisting mainly of Ag-Pb powder, having a ratio of 9 to 1 and glass a ratio of 9 to 1 and glass frit and the like added thereto, is applied on the baked blocks at both ends and the middle section thereof, and further baked at 850° C. for 30 minutes, thereby forming the first external electrode 10, the second external electrode 11 and the third external electrode 12.

Figure 5:
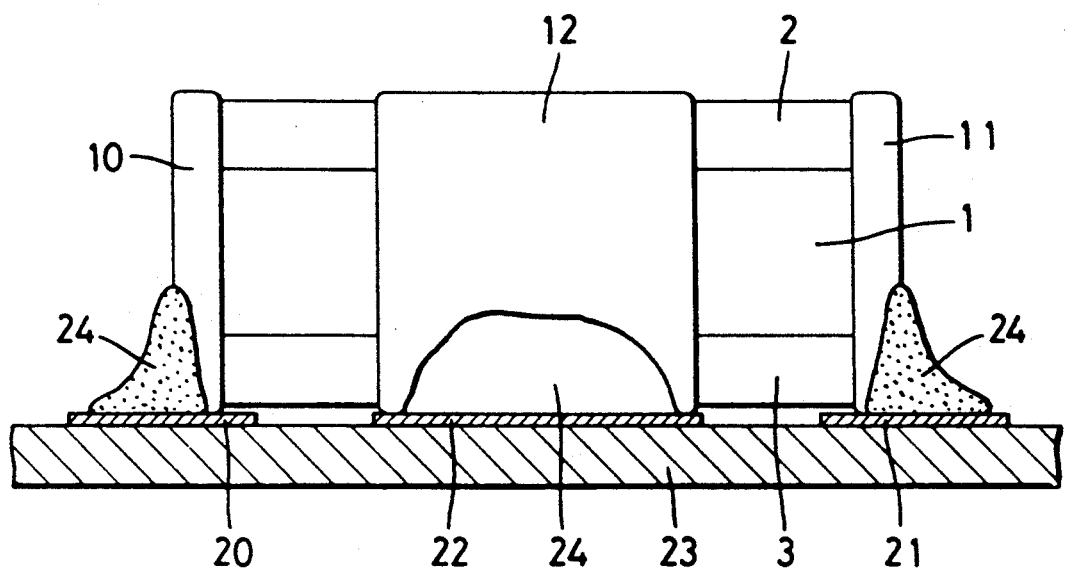
FIG. 5 is a longitudinal cross-sectional view showing the condition in which the above structure is soldered on a printed circuit board.
Figure 6:
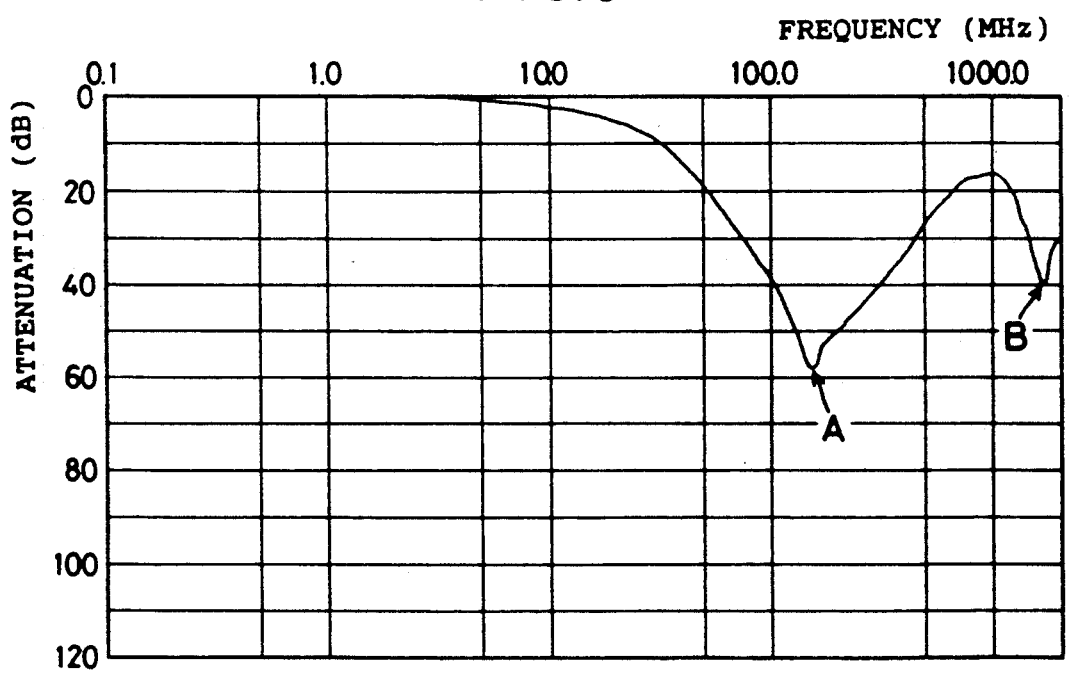
FIG. 6 is a graph showing the frequency characteristics of the above example.
Figure 7:
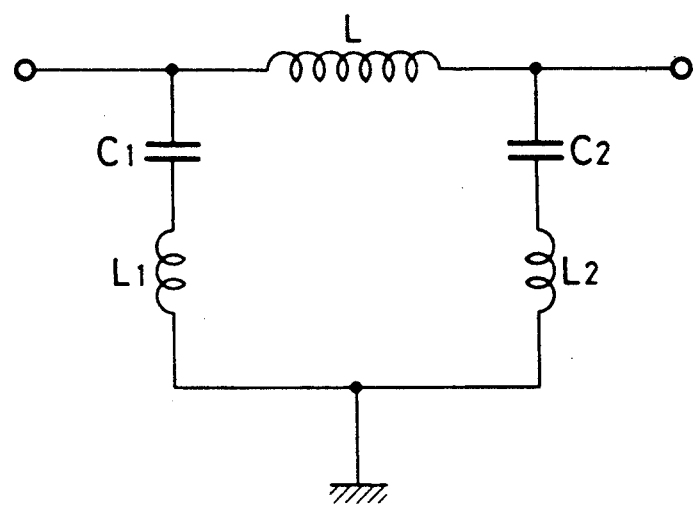
FIG. 7 is an equivalent circuit diagram of the same.

The method of designing and forming a $\pi$ type LC filter according to the present invention is such that the length and width of each of the capacitor electrodes 5, 6, 7 and 8, the first external electrode 10, the second external electrode 11 and the third external electrode 12 of the $\pi$ type LC filter are designed and formed such that when the $\pi$ type LC filter is mounted by soldering 24 on a printed circuit board 23 having surface electrodes 20, 21 and 22 formed thereon as shown in FIG. 5, the ratio $\alpha$ between a lead inductance component $L_1$ generated by the surface electrode 20, the first external electrode 10, the capacitor electrode 5, the capacitor electrode 6, the third external electrode 12, and the surface electrode 22, and a lead inductance component $L_2$ generated by the surface electrode 21, the second external electrode 11, the capacitor electrode 7, the capacitor electrode 8, the third external electrode 12 and the surface electrode 22, is set at a certain value so that deterioration of the insertion loss characteristic in the frequency range which is higher than that of the previously described bottom section can be prevented. Specifically, the ratio $\alpha$ between the lead inductance component $L_1$ and the lead inductance component $L_2$ is set between 1.2 and 2.3.

The inductance components $L_1$ and $L_2$ increase as the electrode length increases and as the electrode width decreases.

Figure 8:
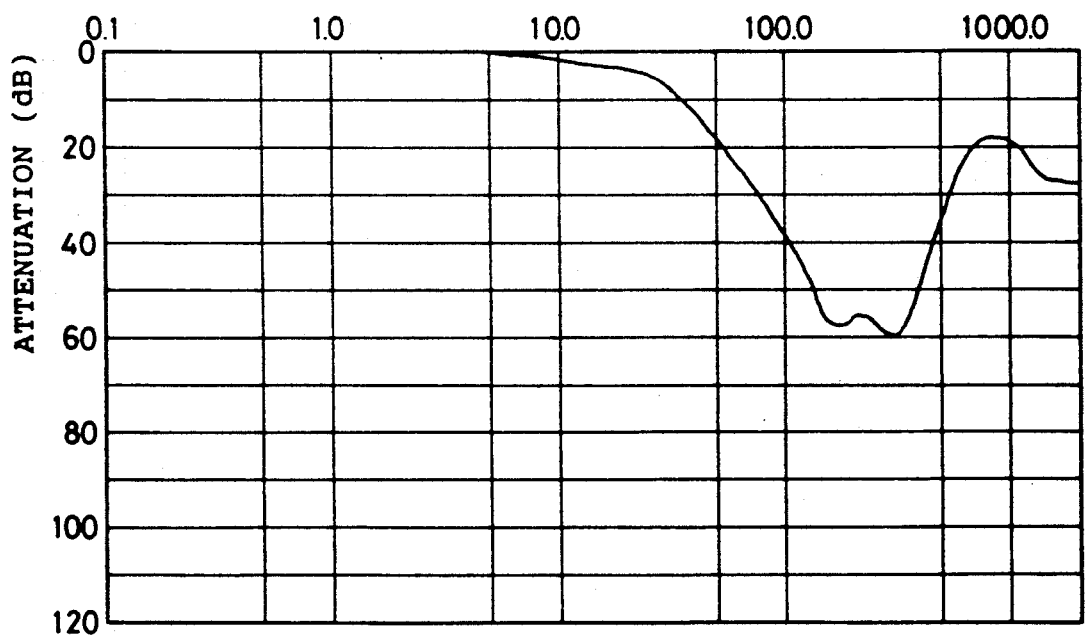
FIG. 8 is a graph showing the frequency characteristics of the $\pi$ type LC filter designed using the designing method according to the present invention.

FIG. 8 is a graph showing the frequency characteristics of a $\pi$ type LC filter designed by the designing method according to the present invention. Specifically, FIG. 8 illustrates the characteristics of a $\pi$ type LC filter having the following values:

$L_1 = 2.2$ (nH)
$L_2 = 3.5$ (nH)
$\alpha = 1.59$

As is evident from FIG. 8, the insertion loss is large and extensive, thus exhibiting good frequency characteristics. In addition, $\pi$ type LC filters (not shown) each having the following values also showed significantly similar frequency characteristics:

| | | |
|---|---|---|
| $L_1 = 3.7$ (nH) | $L_2 = 2.0$ (nH) | $\alpha = 1.85$ |
| $L_1 = 6.2$ (nH) | $L_2 = 2.0$ (nH) | $\alpha = 2.06$ |
| $L_1 = 1.4$ (nH) | $L_2 = 2.0$ (nH) | $\alpha = 1.43$ |

Figure 9:
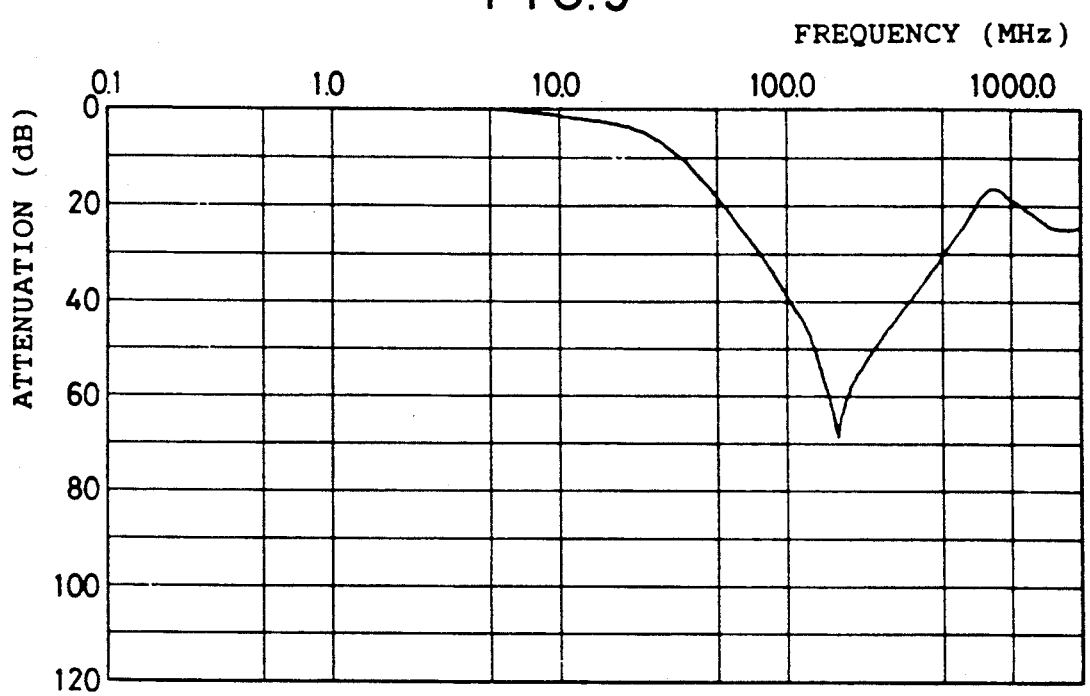
FIGS. 9 and 10 are graphs showing the frequency characteristics of the $\pi$ type LC filters designed using designing methods not according to the present invention.

FIG. 9 is a graph showing the frequency characteristics of a $\pi$ type LC filter designed and formed by a method not in accordance with the present invention and having the following values:

$L_1 = 3.4$ (nH)
$L_2 = 3.8$ (nH)
$\alpha = 1.15$

As is evident from FIG. 9, the insertion loss at the bottom section is large (i.e. 70 dB). However, in the frequency range higher than that of the bottom section, the insertion loss sharply decreases. In addition, a $\pi$ type LC filter (not shown) having the following values also showed significantly similar frequency characteristics:

$L_1 = 3.5$ (nH)
$L_2 = 3.4$ (nH)
$\alpha = 1.03$

Figure 10:
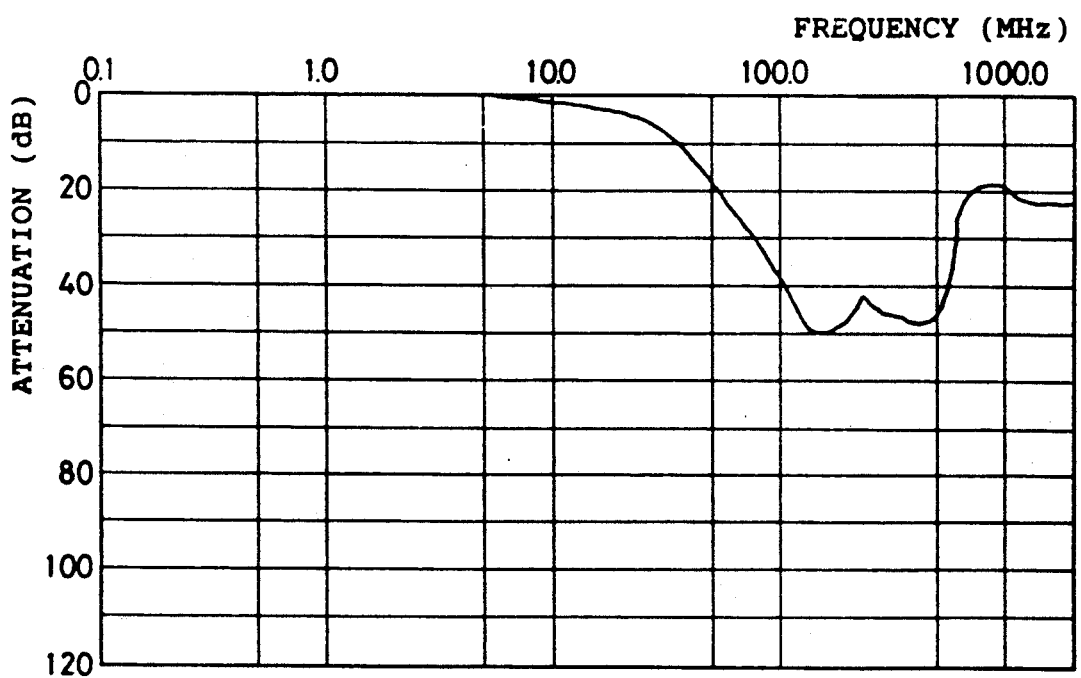

Further FIG. 10 shows the frequency characteristics of a $\pi$ type LC filter which was designed and formed using a method not according to the present invention and which has the following values:

$L_1 = 2.1$ (nH)
$L_2 = 4.9$ (nH)
$\alpha = 2.33$

As can be seen from FIG. 10, the insertion loss does not increase. In addition, a $\pi$ type LC filter (not shown) having the following values also showed significantly similar frequency characteristics:

$L_1 = 5.0$ (nH)
$L_2 = 2.0$ (nH)
$\alpha = 2.50$

The designing method according to the present invention provides a good noise removal effect because the insertion loss can be widely obtained in the frequency band of a $\pi$ type LC filter noise component.

What is claimed is:

1. In a method of designing a $\pi$ type LC filter, said $\pi$ type LC filter including a laminated body having top and bottom dielectric layers and a magnetic material layer disposed between said top and bottom dielectric layers, first and second external electrodes located at opposite ends of said laminated body, a third external electrode located at a portion of said laminated body intermediate said opposite ends, an inductor formed by at least one conductor line located within said magnetic material layer in which one end of said conductor line is connected to said first external electrode and another end of said conductor line is connected to said second external electrode, a first capacitor formed by parallel first and second capacitor electrodes located within said top dielectric layer in which said first capacitor electrode is connected to said first external electrode and said second capacitor electrode is connected to said third external electrode, a second capacitor formed by parallel third and fourth capacitor electrodes located within said bottom dielectric layer in which said third capacitor electrode is connected to said second external electrode and said fourth capacitor electrode is connected to said third external electrode, wherein said first external electrode is soldered to a first surface electrode of a substrate, said second external electrode is soldered to a second surface electrode of said substrate, and said third external electrode is soldered to a third surface electrode of said substrate, the improvement comprising:

determining dimensions of said first thru third external electrodes and said first thru fourth capacitor electrodes such that a ratio $\alpha$ is greater than or equal to 1.2 and less than or equal to 2.3, where $\alpha = L_1/L_2$ when $L_1 > L_2$,
where $\alpha = L_2/L_1$ when $L_2 > L_1$,
where $L_1$ is a lead inductance of said $\pi$ type LC filter formed via said first capacitor from said first surface electrode to said third surface electrode by said first external electrode, said first and second capacitor electrodes, and said third external electrode, and where $L_2$ is a lead inductance of said $\pi$ type LC filter formed via said second capacitor from said second surface electrode to said third surface electrode by said second external electrode, said third and fourth capacitor electrodes, and said third external electrode.

2. A method of forming a $\pi$ type LC filter, comprising:

forming a laminated body having top and bottom dielectric layers and a magnetic material layer disposed between said top and bottom dielectric layers; p1 forming first and second external electrodes located at opposite ends of said laminated body, and a third external electrode located at a portion of said laminated body intermediate said opposite ends;

forming an inductor including at least one conductor line located within said magnetic material layer in which one end of said conductor line is connected to said first external electrode and another end of said conductor line is connected to said second external electrode;

forming a first capacitor including parallel first and second capacitor electrodes located within said top dielectric layer in which said first capacitor electrode is connected to said first external electrode and said second capacitor electrode is connected to said third external electrode;

forming a second capacitor including parallel third and fourth capacitor electrodes located within said bottom dielectric layer in which said third capacitor electrode is connected to said second external electrode and said fourth capacitor electrode is connected to said third external electrode;

wherein said first external electrode is for soldering to a first surface electrode of a substrate, said second external electrode is for soldering to a second surface electrode of said substrate, and said third external electrode is for soldering to a third surface electrode of said substrate;

forming said first thru third external electrodes and said first thru fourth capacitor electrodes such that a ratio $\alpha$ is greater than or equal to 1.2 and less than or equal to 2.3, where $\alpha = L_1/L_2$ when $L_1 > L_2$,
where $\alpha = L_2/L_1$ when $L_2 > L_1$,
where $L_1$ is a lead inductance of said $\pi$ type LC filter formed via said first capacitor from said first surface electrode to said third surface electrode by said first external electrode, said first and second capacitor electrodes, and said third external electrode, and where $L_2$ is a lead inductance of said $\pi$ type LC filter formed via said second capacitor from said second surface electrode to said third surface electrode by said second external electrode, said third and fourth capacitor electrodes, and said third external electrode.

* * * * *